(12) United States Patent
Lee et al.

(10) Patent No.: US 9,159,625 B1
(45) Date of Patent: Oct. 13, 2015

(54) SEMICONDUCTOR DEVICE

(75) Inventors: Seung Jae Lee, Seoul (KR); Sang Won Kim, Seoul (KR); Ki Cheol Bae, Kyunggi-do (KR); Ji Heon Yu, Seoul (KR)

(73) Assignee: Amkor Technology, Inc., Tempe, AZ (US)

(*) Notice: Subject to any disclaimer, the term of this patent is extended or adjusted under 35 U.S.C. 154(b) by 269 days.

(21) Appl. No.: 13/015,445

(22) Filed: Jan. 27, 2011

(51) Int. Cl.
*H01L 23/48* (2006.01)
*H01L 21/78* (2006.01)

(52) U.S. Cl.
CPC .................. *H01L 21/7806* (2013.01)

(58) Field of Classification Search
CPC .............. H01L 2924/0002; H01L 2924/00; H01L 21/76898; H01L 2225/06513; H01L 2225/06541; H01L 23/481; H01L 23/5225; H01L 25/50; H01L 27/222; H01L 2924/3011; H01L 43/12
USPC ......................................................... 257/741
See application file for complete search history.

(56) References Cited

U.S. PATENT DOCUMENTS

| | | | | |
|---|---|---|---|---|
| 7,074,629 B2* | 7/2006 | Yao et al. | ......................... | 438/14 |
| 7,501,586 B2* | 3/2009 | Wig et al. | ..................... | 174/262 |
| 7,847,654 B2* | 12/2010 | Lascari | ........................... | 333/33 |
| 8,035,992 B2* | 10/2011 | Kushta et al. | ................. | 361/818 |
| 8,143,976 B2* | 3/2012 | Wyland | ........................ | 333/260 |
| 2002/0179332 A1* | 12/2002 | Uematsu et al. | ............... | 174/262 |
| 2003/0091730 A1* | 5/2003 | Jessep et al. | ..................... | 427/97 |
| 2004/0069529 A1* | 4/2004 | Oggioni et al. | ............... | 174/262 |
| 2005/0098348 A1* | 5/2005 | Okumichi et al. | ............ | 174/262 |
| 2009/0116207 A1* | 5/2009 | Lim et al. | ...................... | 361/807 |
| 2010/0019859 A1* | 1/2010 | Lascari | ........................... | 333/33 |
| 2011/0215882 A1* | 9/2011 | Cornic et al. | .................. | 333/136 |
| 2012/0187550 A1* | 7/2012 | Wu | ............................... | 257/659 |

* cited by examiner

*Primary Examiner* — Stephen W Smoot
*Assistant Examiner* — Edward Chin
(74) *Attorney, Agent, or Firm* — McAndrews, Held & Malloy

(57) ABSTRACT

Disclosed is a semiconductor device. For instance, the semiconductor device includes a main via formed on a dielectric and a ground via formed in a circular arc shape and spaced apart from the main via. The semiconductor device is superior in electric characteristics such as insertion loss or reflection loss and allows efficient use of space.

19 Claims, 6 Drawing Sheets

SEMICONDUCTOR DEVICE

TECHNICAL FIELD

The present invention relates to a semiconductor device.

BACKGROUND

Increasing integration density of various electronic devices is used as a mechanism to improve performance and/or reduce size. Integration density be enhanced by reducing a minimum device size or a stacking a plurality of dies.

Recently, a method of forming a penetration silicon via has been widely used to improve integration density. In general, a penetration silicon via is formed by forming a vertical via through a substrate and filling the via with a conductive material such as Cu.

Such a via is formed using a laser or an etching process, and the via is used to connect patterns of different layers. A ground via is formed around such a via, and the impedance of a pattern varies according to the position and shape of the ground via.

BRIEF DESCRIPTION OF THE DRAWINGS

In order to understand the invention and to see how it may be carried out in practice, embodiments will now be described, by way of non-limiting example only, with reference to the accompanying drawings, in which.

Common reference numerals are used throughout the drawings and the detailed description to indicate the same elements.

DETAILED DESCRIPTION

Figure 1A:
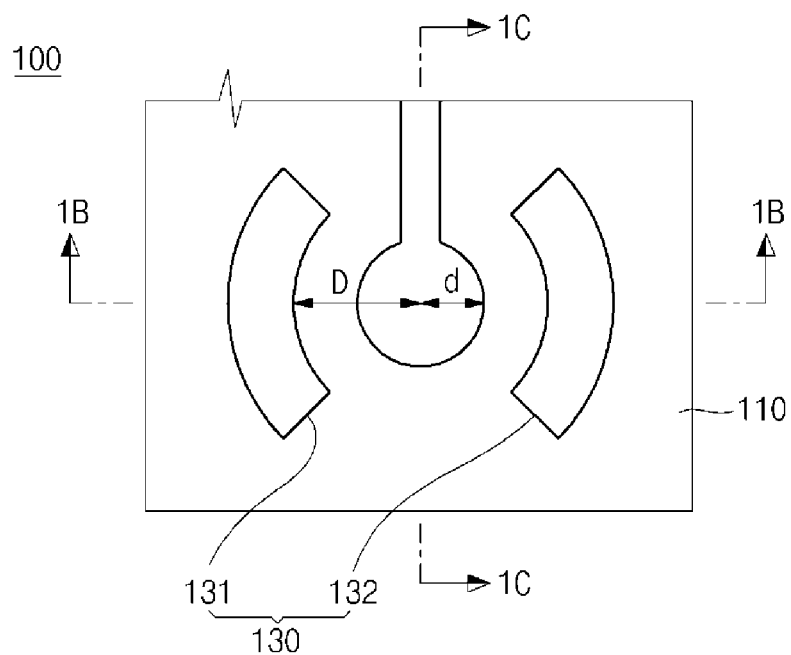
FIG. 1A is a plan view illustrating a semiconductor device according to an embodiment of the present invention.
Figure 1B:
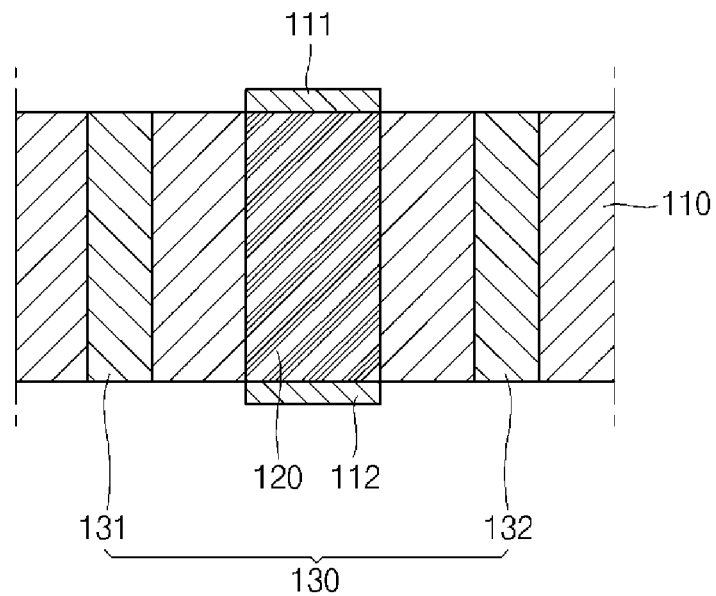
FIG. 1B is a sectional view taken along line 1B-1B of FIG. 1A.
Figure 1C:
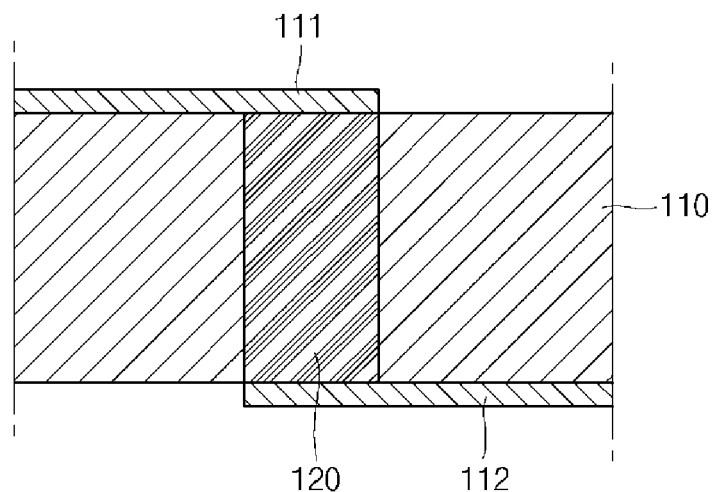
FIG. 1C is a sectional view taken along line 1C-1C of FIG. 1A.

Referring to FIG. 1A, a plan view of a semiconductor device is shown according to an embodiment of the present invention, and referring to FIG. 1B, a sectional view taken along line 1B-1B of FIG. 1A is shown. Referring to FIG. 1C, a sectional view taken along line 1C-1C of FIG. 1A is shown.

As shown in FIGS. 1A through 1C, according to one embodiment of the present invention, a semiconductor device 100 includes a dielectric 110, a main via 120, and at least one ground via 130. Here, the dielectric 110, the main via 120, and the at least one ground via 130 may be formed on a wafer, a semiconductor die, or a circuit board.

The dielectric 110 has approximately flat top and bottom surfaces. The main via 120 and the ground via 130 may be formed through the top and bottom surfaces of the dielectric 110. The dielectric 110 may be formed of a material selected from polyimide (Pi), benzo cyclo butene (BCB), poly benz oxazole (PBO), bismaleimide triazine (BT), phenolic resin, epoxy, silicone, SiO2, Si3N4 and an equivalent thereof, but the present invention is not limited thereto.

In addition, a first signal pattern 111 may be formed on the top surface of the dielectric 110, and a second signal pattern 112 may be formed on the bottom surface of the dielectric 110. The first signal pattern 111 and the second signal pattern 112 are paths through which signals are transmitted. The first signal pattern 111 and the second signal pattern 112 may include Cu, Ti, Ni, Pd or a equivalent thereof, but not limited thereto.

The main via 120 is formed through the top and bottom surfaces of the dielectric 110. The main via 120 is electrically connected to the first signal pattern 111 and the second signal pattern 112. That is, the main via 120 electrically connects the first signal pattern 111 formed on the top surface of the dielectric 110 and the second signal pattern 112 formed on the bottom surface. In addition, the main via 120 may be formed of a conductive material for electrically connecting the first signal pattern 111 and the second signal pattern 112. For example, the main via 120 may be formed of a material selected from Au, Ag, Cu, and a combination thereof.

The at least one ground via 130 is formed in a circular arc shape at a position spaced apart from the main via 120. For example, two ground vias 130 are formed at both sides of the main via 120 by using a laser or an etching process. In addition, the ground vias 130 formed at both sides of the main via 120 are not connected to each other so that the first and second signal patterns 111 and 112 electrically connected to the main via 120 can pass between the ground vias 130. That is, the radian angles of the ground vias 130 are great than 0 but smaller than 7E. In the description of the semiconductor device 100 of the current embodiment, the case where the radian angles of the ground vias 130 are $\pi/2$ will be explained.

The ground vias 130 include a first ground via 131 and a second ground via 132.

The first ground via 131 is formed at one side of the main via 120, and the second ground via 132 is at the other side of the main via 120. The first ground via 131 and the second ground via 132 are symmetric in shape and position with reference to the main via 120.

In the semiconductor device 100 of the current embodiment of the present invention, a certain capacitance value exists between the main via 120 and the ground vias 130. Also, in the semiconductor device 100 of the current embodiment of the present invention, a certain inductance value exists between the main via 120 and the ground vias 130.

In FIG. 1A, d denotes the radius of the main via 120, and D denotes a distance from the center of the main via 120 to the ground via 130.

Figure 2A:
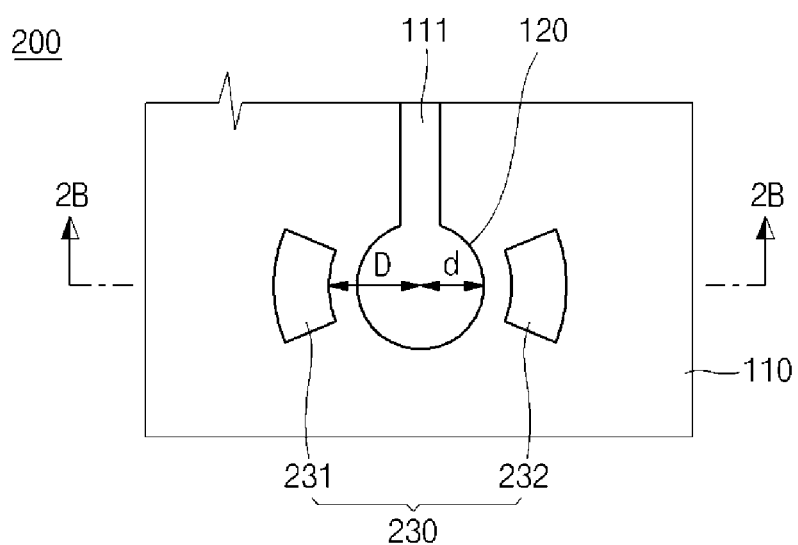
FIG. 2A is a plan view illustrating a semiconductor device according to another embodiment of the present invention.
Figure 2B:
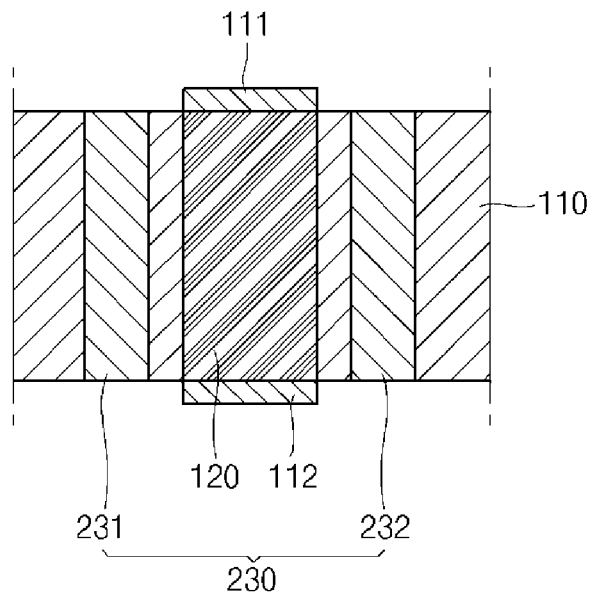
FIG. 2B is a sectional view taken along line 2B-2B of FIG. 2A.

Referring to FIG. 2A, a plan view of a semiconductor device is shown according to another embodiment of the present invention, and referring to FIG. 2B, a sectional view taken along line 2B-2B of FIG. 2A is shown.

Herein, a semiconductor device 200 shown in FIGS. 2A and 2B is similar to the semiconductor device 100 shown in FIGS. 1A through 1C. Thus, a description will be given on the difference.

As shown in FIGS. 2A and 2B, according to the other embodiment of the present invention, the semiconductor device 200 includes a dielectric 110, a main via 120, and ground vias 230.

The ground vias 230 are formed in a circular arc shape and spaced apart from the main via 120. The ground vias 230 are formed at both sides of the main via 120. In addition, the ground vias 230 formed at both sides of the main via 120 are not connected to each other such that signal patterns 111 and 112 electrically connected to the main via 120 can pass between the ground vias 230. That is, the radian angles of the ground vias 230 are greater than 0 but smaller than π. In the description of the semiconductor device 200 of the other embodiment of the present invention, the case where the radian angles of the ground vias 230 are π/4 will be explained.

The ground vias 230 include a first ground via 231 and a second ground via 232.

The first ground via 231 is formed at one side of the main via 120, and the second ground via 232 is formed at the other side of the main via 120. The first ground via 231 and the second ground via 232 are symmetric in shape and position with respect to the main via 120.

In the semiconductor device 200 of the other embodiment of the present invention, a capacitance value and an inductance value exist between the main via 120 and the ground vias 230.

If the radian angles of the ground vias 230 become smaller from π/2 to π/4, the capacitance value decreases but the inductance value increases between the main via 120 and the ground vias 230. Of course, it is assumed that d and D are not varied although the radian angles of the ground via 230 are varied.

As the radian angles of the ground vias 230 gets smaller, the areas of the ground vias 230 become smaller.

Next, insertion loss and reflection loss of a semiconductor device of the present invention will be described in comparison with those of a semiconductor device of the related art.

Figure 3:
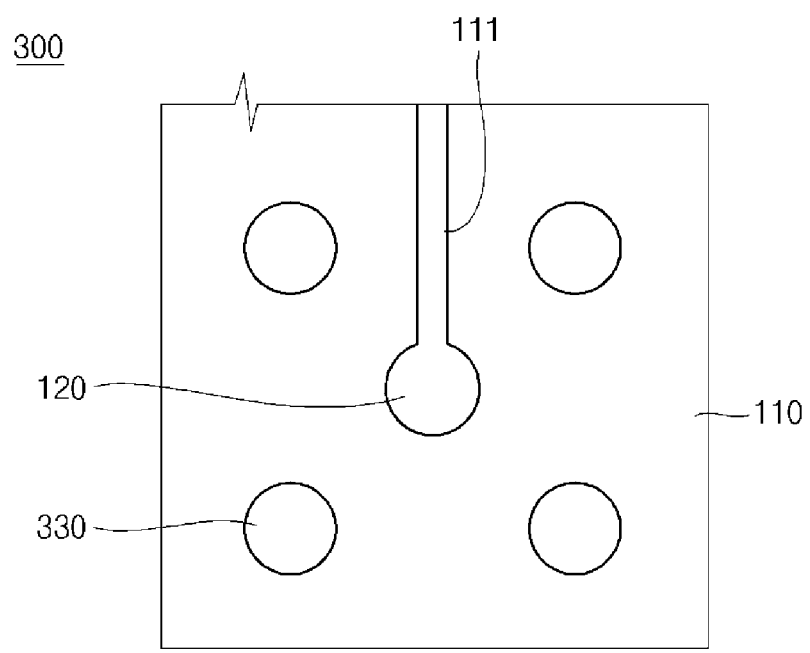
FIG. 3 is a plan view illustrating a semiconductor device of the related art.
Figure 4:
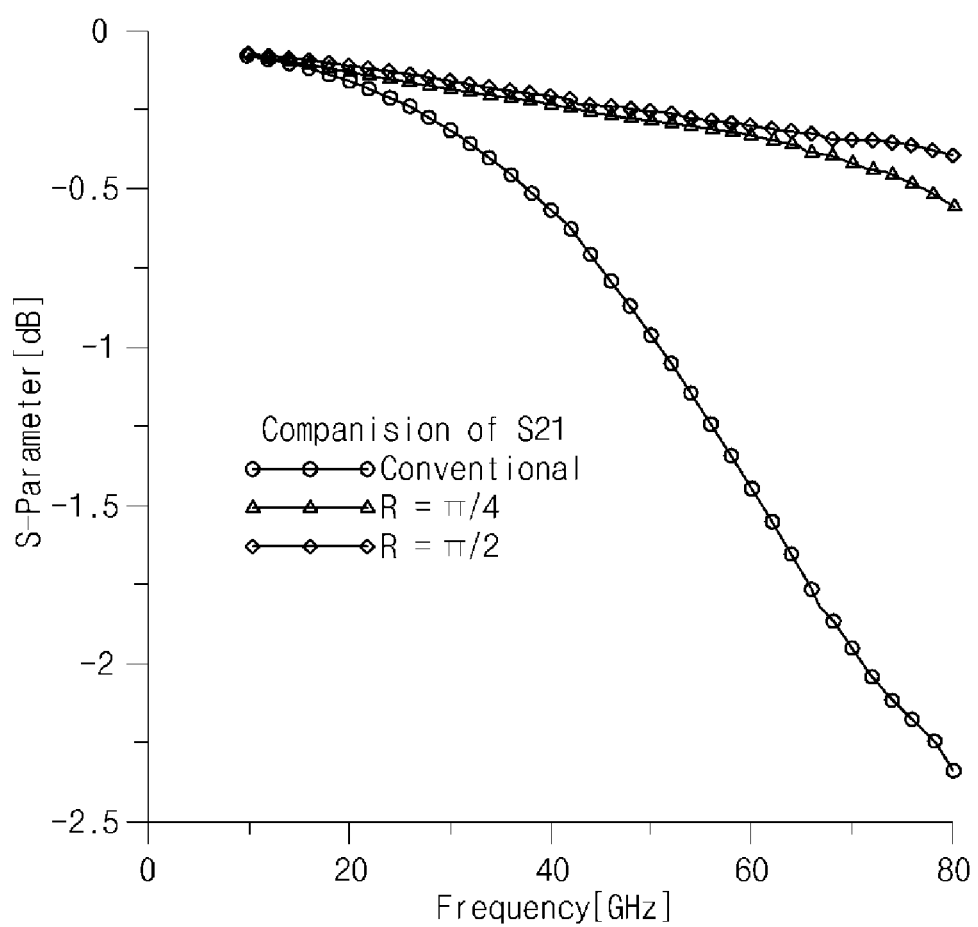
FIG. 4 is a graph illustrating insertion loss of a related-art semiconductor device and insertion loss of the semiconductor devices of the present invention.
Figure 5:
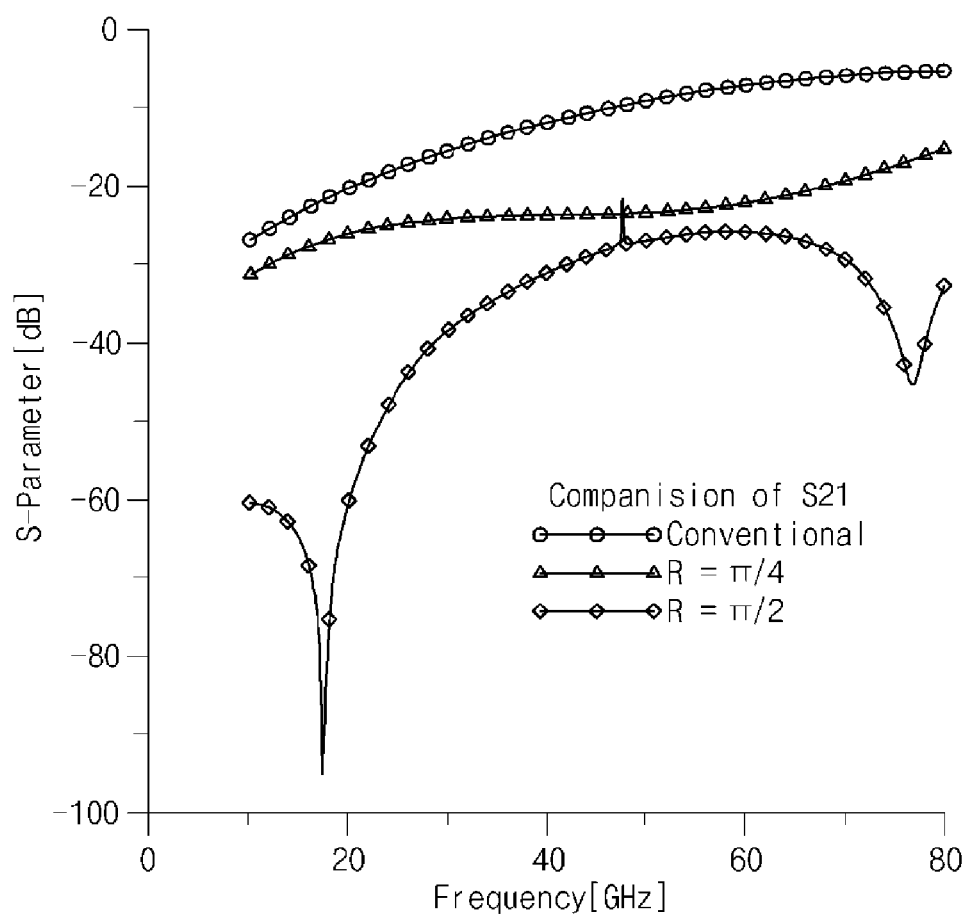
FIG. 5 is a graph illustrating reflection loss of the related-art semiconductor device and reflection loss of the semiconductor devices of the present invention.

Referring to FIG. 3, a plan view of a semiconductor device of the related art is shown. Referring to FIG. 4, insertion loss of the semiconductor devices of the present invention and insertion loss of the semiconductor device of the related art are shown in a graph. Referring to FIG. 5, reflection loss of the semiconductor devices of the present invention and reflection loss of the semiconductor device of the related are shown in a graph.

As illustrated in FIG. 3, in a semiconductor device 300 of the related art, ground vias 330 are formed in all directions around a main via 120. That is, four ground vias 330 are formed.

Referring to FIG. 4, insertion losses of the semiconductor devices 100 and 200 of the present invention and insertion loss of the related-art semiconductor device 300 are shown by using S-parameter. It can be understood that that the semiconductor devices 100 and 200 of the present invention have lower insertion loss than the related-art semiconductor device 300.

Referring to FIG. 4, in the semiconductor device of the embodiment of the present invention, if a signal having a frequency of 0 to 80 GHz is input to the main via 120, the insertion loss ranges between 0 dB and −0.5 dB. At this time, the radian angles of the ground vias 130 are π/2.

Also, in the semiconductor device 200 of the other embodiment of the invention, if a signal having a frequency of 0 to 80 GHz is input to the main via 120, the insertion loss ranges between 0 dB and −0.5 dB. At this time, the radian angles of the ground vias 230 are n/4.

Here, S21 indicates an insertion loss from a port 1 to a port 2. For example, if S21 is −3 dB, it means that the loss of a signal is 3 dB while the signal is transmitted from the port 1 to port 2, and if S21 is −10 dB, it means that the loss of a signal is 10 dB while the signal is transmitted from the port 1 to port 2. Thus, a large value of S21 (that is, a low absolute value of S21) indicates a low insertion loss.

As shown in FIG. 5, reflection losses of the semiconductor devices 100 and 200 of the present invention and reflection loss of the related-art semiconductor device 300 are shown by using S-parameter. It can be understood that the semiconductor devices 100 and 200 of the present invention have lower reflection losses than the related-art semiconductor device 300.

Referring to FIG. 5, in the semiconductor device 100 of the embodiment of the present invention, when a signal having a frequency of 0 to 80 GHz is input to the main via 120, the reflection loss is lower than −20 dB. At this time, the radian angles of the ground vias 120 are π/2. Specifically, in the semiconductor device 100 of the embodiment of the present invention, when a signal having a frequency of 10 to 20 GHz is input to the main via 120, the reflection loss is less than −60 dB. Furthermore, in the semiconductor device 100 of the embodiment of the present invention, when a signal having a frequency of 70 to 80 GHz is input to the main via 120, the reflection loss ranges between −30 dB and −50 dB. That is, the semiconductor device 100 of the embodiment of the present invention resonates in a frequency range of 10 to 20 GHz or a frequency range of 70 to 80 GHz. That is, the impedance matching of the semiconductor device 100 is good at the frequency range.

In the semiconductor device 200 of the other embodiment of the present invention, when a signal having a frequency of 0 to 80 GHz is input to the main via 120, the reflection loss ranges between about −10 dB and about −30 dB. At this time, the radian angles of the ground vias 230 are π/4.

Here, S21 indicates a reflection loss at the port 1. The case where S21 is zero means that all input signal is reflected (total reflection). That is, a low value of S21 (that is, a large absolute value of S21) indicates low reflection.

As described above, the semiconductor device 100 of the embodiment of the invention has the ground vias 130 formed in a circular arc shape and spaced apart from the main via 120. Thus, the electric characteristics of the semiconductor device 100 such as insertion loss and reflection loss can be improved.

In addition, since the semiconductor device 100 of the embodiment of the invention has the ground vias 130 formed in a circular arc shape and spaced apart from the main via 120, spaces can be efficiently used.

Figure 6:
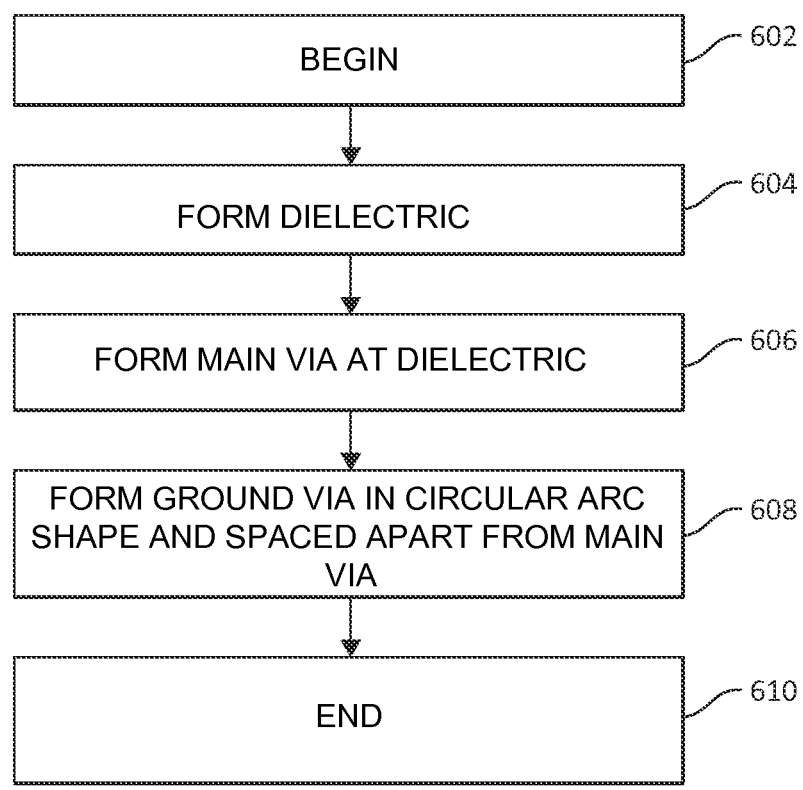
FIG. 6 is a flow chart diagram illustrating an exemplary method of manufacture of a semiconductor device of the present invention.

Referring to FIG. 6, an exemplary method of manufacture for a semiconductor device, such as semiconductor device 100, is illustrated. The method begins (step 602) by forming a dielectric (step 604). A main via is formed at the dielectric (step 606). A ground via is formed in a circular arc shape and spaced apart from the main via (step 608). The method then ends (step 610).

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device, comprising:
   a dielectric;
   a main via formed through the dielectric; and
   a ground via comprising two circular arc segments extending through the dielectric and spaced apart from the main via, wherein a radian angle characterizing each of the two circular arc segments of the ground via is about $\pi/4$, and a reflection loss ranges from about −10 dB to about −30 dB for signals at all frequencies between 0 GHz and 80 GHz input to the main via.

2. The semiconductor device of claim 1, wherein a first of the two circular arc segments is formed at a first side of the main via and a second of the two arc segments is formed at a second side of the main via, the second side opposing the first side, and wherein the two circular arc segments are symmetric in shape and position about the main via.

3. The semiconductor device of claim 1, wherein a first signal pattern is formed on a top surface of the dielectric, and a second signal pattern is formed on a bottom surface of the dielectric, and the main via electrically connects the first signal pattern and the second signal pattern.

4. The semiconductor device of claim 1, wherein the dielectric is formed of a material comprising one or more of polyimide (Pi), benzo cyclo butene (BCB), poly benz osazole (PBO), bismaleimide triazine (BT), phenolic resin, epoxy, silicone, $SiO_2$, $Si_3N_4$ and/or an equivalent thereof.

5. The semiconductor device of claim 1, wherein the main via is formed of a material comprising one or more of Au, Ag, and/or Cu.

6. The semiconductor device of claim 3, wherein the first signal pattern and the second signal pattern extend in opposite directions from the main via.

7. The semiconductor device of claim 1, wherein the dielectric, the main via and the ground via are formed on one of a wafer, a semiconductor die, and a circuit board.

8. The semiconductor device of claim 1, wherein an insertion loss ranges between about 0 dB and about −0.5 dB for signals at all frequencies between 0 GHz and 80 GHz input to the main via.

9. The semiconductor device of claim 1, wherein the main via is centered between the circular arc segments.

10. The semiconductor device of claim 1, wherein at least one of the first and second signal patterns includes material comprising one or more of Cu, Ti, Ni, Pd, and/or an equivalent thereof.

11. The semiconductor device of claim 1, wherein the main via is cylindrical.

12. A semiconductor device, comprising:
a dielectric;
a main via formed through the dielectric; and
a first ground via comprising a circular arc segment extending through the dielectric at a first side of the main via;
a second ground via comprising a circular arc segment extending through the dielectric at a second side of the main via, the second side opposing the first side;
wherein:
the first ground via and the second ground via are spaced apart from the main via, and symmetric in shape and position about the main via; and
a radian angle characterizing each of the first and second ground via circular arc segments is about $\pi/4$, and a reflection loss ranges from about −10 dB to about −30 dB for signals at all frequencies between 0 GHz and 80 GHz input to the main via.

13. The semiconductor device of claim 12, further including:
a first signal pattern on a top surface of the dielectric, and
a second signal pattern on a bottom surface of the dielectric;
wherein the main via electrically connects the first and second signal patterns.

14. The semiconductor device of claim 13, wherein:
the dielectric is formed of a material comprising one or more of polyimide (Pi), benzo cyclo butene (BCB), poly benz osazole (PBO), bismaleimide triazine (BT), phenolic resin, epoxy, silicone, $SiO_2$, $Si_3N_4$ and/or an equivalent thereof,
the main via is formed of a material comprising one or more of Au, Ag, and/or Cu, and
at least one of the first and second signal patterns includes material comprising one or more of Cu, Ti, Ni, Pd, and/or an equivalent thereof.

15. The semiconductor device of claim 12, wherein the dielectric, the main via and the ground via are formed on one of a wafer, a semiconductor die, and a circuit board.

16. A method of manufacturing a semiconductor device, comprising:
forming a dielectric;
forming a main via through the dielectric; and
forming a ground via comprising two circular arc segments extending through the dielectric and spaced apart from the main via, wherein a radian angle characterizing each of the two circular arc segments of the ground via is about $\pi/4$, and a reflection loss ranges from about −10 dB to about −30 dB for signals at all frequencies between 0 GHz and 80 GHz input to the main via.

17. The method of manufacture of claim 16, wherein said forming the ground via comprises forming a first of the two circular arc segments at a first side of the main via and forming a second of the two circular arc segments at a second side of the main via, the second side opposing the first side, wherein the two circular arc segments are symmetric in shape and position about the main via.

18. The method of manufacture of claim 16, comprising:
forming a first signal pattern on a top surface of the dielectric, and forming a second signal pattern on a bottom surface of the dielectric;
wherein the main via electrically connects the first signal pattern and the second signal pattern.

19. The method of manufacture of claim 16, wherein the dielectric, the main via and the ground via are formed on one of a wafer, a semiconductor die, and a circuit board.

* * * * *